(12) United States Patent
Adler et al.

(10) Patent No.: US 10,568,214 B2
(45) Date of Patent: Feb. 18, 2020

(54) METHOD FOR PRODUCING MULTI-LEVEL METALIZATION ON A CERAMIC SUBSTRATE

(71) Applicant: CeramTec GmbH, Plochingen (DE)

(72) Inventors: Sigurd Adler, Affalterbach (DE); Roland Dilsch, Thierstein (DE); Alfred Thimm, Wunsiedel (DE)

(73) Assignee: CeramTec GmbH, Plochingen (DE)

( * ) Notice: Subject to any disclaimer, the term of this patent is extended or adjusted under 35 U.S.C. 154(b) by 0 days.

(21) Appl. No.: 15/627,703

(22) Filed: Jun. 20, 2017

(65) Prior Publication Data

US 2017/0290169 A1 Oct. 5, 2017

Related U.S. Application Data

(63) Continuation of application No. 14/763,694, filed as application No. PCT/EP2014/052177 on Feb. 5, 2014, now abandoned.

(30) Foreign Application Priority Data

Feb. 7, 2013 (DE) .................. 10 2013 202 008

(51) Int. Cl.
  *H05K 3/00* (2006.01)
  *H05K 3/12* (2006.01)
  *H01L 23/498* (2006.01)
  *H01L 21/48* (2006.01)
  *C22F 1/08* (2006.01)
  *H05K 1/03* (2006.01)
  *H05K 3/22* (2006.01)

(52) U.S. Cl.
  CPC .............. *H05K 3/1216* (2013.01); *C22F 1/08* (2013.01); *H01L 21/4867* (2013.01); *H01L 23/49844* (2013.01); *H05K 1/0306* (2013.01); *H05K 3/22* (2013.01); *H01L 2924/0002* (2013.01); *Y10T 428/24355* (2015.01)

(58) Field of Classification Search
  CPC ...... H05K 3/1216; H05K 3/22; H05K 1/0306; H01L 21/4867; H01L 23/49844; H01L 2924/0002
  USPC .............................. 427/97.1, 97.3, 97.4, 97.6
  See application file for complete search history.

(56) References Cited

U.S. PATENT DOCUMENTS 3,074,143 A * 1/1963 Smith .................. C04B 41/009
                                                156/89.21
3,504,223 A * 3/1970 Bickford ................. H01J 23/26
                                                29/605

(Continued)

FOREIGN PATENT DOCUMENTS

DE        102009000491       *   8/2010
EP          0 529 298 A2        3/1993
(Continued)

*Primary Examiner* — Brian K Talbot
(74) *Attorney, Agent, or Firm* — Norton Rose Fulbright US LLP

(57) ABSTRACT

A method for producing a copper multi-level metallization on a ceramic substrate consisting of AlN or $Al_2O_3$. High power regions with metallization having a high current-carrying capacity and low power regions with metallic coatings having a low current-carrying capacity are created on one and the same ceramic substrate. The metallization is printed multiple times in the high power range.

11 Claims, 1 Drawing Sheet

(56) References Cited

U.S. PATENT DOCUMENTS

| | | | | |
|---|---|---|---|---|
| 3,809,797 | A | * | 5/1974 | McMunn, III ........ H01L 23/057 |
| | | | | 106/1.13 |
| 5,126,206 | A | | 6/1992 | Garg et al. |
| 5,156,903 | A | * | 10/1992 | Okumura ................ B32B 18/00 |
| | | | | 428/209 |
| 5,202,153 | A | | 4/1993 | Siuta |
| 5,736,456 | A | | 4/1998 | Akram |
| 6,404,640 | B1 | | 6/2002 | Ishimine et al. |
| 6,621,707 | B2 | | 9/2003 | Ishimine et al. |
| 7,239,219 | B2 | | 7/2007 | Brown et al. |
| 8,350,369 | B2 | | 1/2013 | Lee et al. |
| 2008/0164588 | A1 | | 7/2008 | Lee et al. |
| 2010/0015468 | A1 | | 1/2010 | Yamamoto et al. |

FOREIGN PATENT DOCUMENTS

| | | | |
|---|---|---|---|
| EP | 0 985 999 A1 | | 3/2000 |
| JP | 08-097553 | * | 4/1996 |
| JP | 08097553 | | 4/1996 |
| JP | 2001353716 | | 12/2001 |
| JP | 2004172182 | | 6/2004 |
| JP | 2007201346 | | 8/2007 |
| JP | 2011216533 | | 10/2011 |

\* cited by examiner

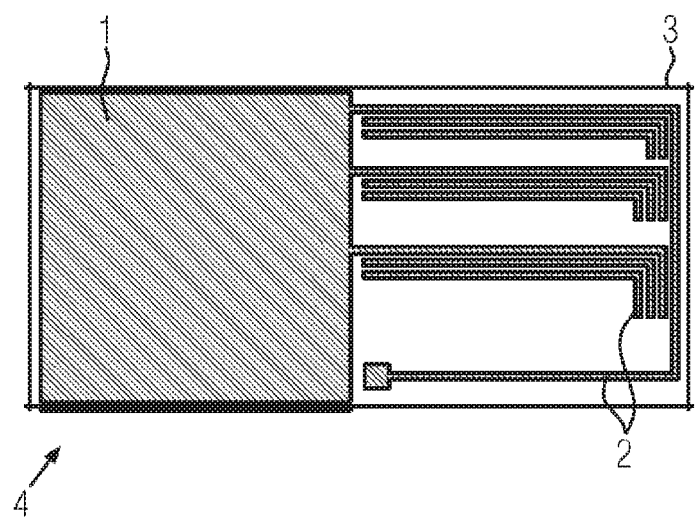

METHOD FOR PRODUCING MULTI-LEVEL METALIZATION ON A CERAMIC SUBSTRATE

CROSS REFERENCE TO RELATED APPLICATIONS

This application is a continuation of U.S. application Ser. No. 14/763,694 filed Jul. 28, 2015, pending, which is a § 371 of International Application No. PCT/EP2014/052177 filed Feb. 5, 2014, and claims priority from German Patent Application No. 10 2013 202 008.2 filed Feb. 7, 2013, each of which is incorporated herein by reference in its entirety for all purposes.

FIELD OF THE INVENTION

The invention relates to a method for producing a copper multi-level metalization on a ceramic substrate composed of AlN or $Al_2O_3$, whereby high power areas with metalization having higher current-carrying capacity and low power areas with metalization having lower current-carrying capacity are created on one and the same ceramic substrate.

BACKGROUND OF THE INVENTION

Metalized ceramic substrates, also referred to as printed circuit boards, having a thick copper layer (typically 200 to 300 μm) are required for power electronic applications, to ensure the required current-carrying capacity. The power semiconductor is soldered upon these. Only comparatively large conductor widths and distances can be implemented on these thick copper structures.

An electronic circuit is required to control the power semiconductor. The components used for this purpose (microcontroller, bus coupler, etc.) and metalized carrier substrates of same have finer and thinner electrical conducting paths and pitch spacings than the carrier substrates for power components. Therefore, they are mounted on a separate metalized substrate. Both carrier substrates are electrically connected with each other via wires. These connections age and incline to failure, which results in breakdown of the entire power module.

Metalizations generally denote electrical conducting paths and planar metalizations on ceramic substrates, in which the conducting paths serve to conduct current and the planar metalizations function, for example, to solder the power semiconductors and connecting elements. Multi-level metalization on a ceramic substrate is understood as metalization of varying thickness. The thickness of the metalization is the extension thereof perpendicular to the surface of the ceramic substrate. This thickness is also described in terms of height or strength.

Another hitherto scarcely used method consists in the application of an electrically insulating layer structured photochemically or by screen printing technology onto the thin copper layer of a conducting path with further electrochemical deposition of copper on the areas left blank. To date, the production of such a multi-stage substrate still requires an expensive galvanic processing and a multiple structuring with plating resists and photo-optical development and stripping of the resist.

OBJECTS OF THE INVENTION

The object of the invention is to improve a method according to the preamble of claim 1, so that with simple means metalizations for high power areas and metalizations for low power areas can be printed on one and the same ceramic substrate (ceramic plate), whereby the high power areas with thick conducting structures should have a particularly good thermal conduction and potential for good heat accumulation.

This object is achieved according to the invention by means of the features of the present invention.

SUMMARY OF THE INVENTION

Characterized in that the following method steps
a) printing a common base metalization for the high power and low power areas which is made of glass-containing copper-based paste using screen- or pad printing with a thickness of 20 to 50 μm,
b) reinforcing the base metalization in the high power areas with multiple or several printings of a copper reinforcement paste without glass component on the base metalization using screen-or stencil printing up to a total copper thickness of 300 to 500 μm,
c) annealing of the metalized ceramic substrates with the high power and low power areas together at 850 to 950° C. under nitrogen,
d) mechanical leveling of the high power areas to create an even surface with a roughness $R_z < 5$ μm.
are carried out consecutively and with simple means metalizations for high power areas and metalizations for low power areas can be printed together and partially electrically connected with each other on one and the same ceramic substrate (ceramic plate), whereby the high power areas with thick conducting structures should have a particularly good thermal conduction and potential for good heat accumulation.

BRIEF DESCRIPTION OF THE FIGURE

The FIGURE depicts a cut-out from a ceramic substrate made of aluminum nitride or aluminum oxide having an applied metalization, which includes a high power area and a low power area.

DETAILED DESCRIPTION

To facilitate soldering, after the leveling the high power and the low power areas are provided without current with a metalization such as Ni, NiP+Pd+Au, Ag or Ni+Au.

To prepare for a later division of the ceramic substrate into separate parts of the substrate, the ceramic substrate can be processed by laser scribing before or after the printing.

As a result, the metalization of the high power areas has an even surface with a roughness $R_z < 5$ μm and thus the contact surface area of the component elements with the metalization is as large as possible, and with leveling is worn down preferably 100 to 150 μm. The leveling is done preferably by grinding.

To improve the adhesiveness of the glassy copper-based paste on the ceramic substrate, the glass proportion of the glass-containing copper-based paste is preferably between 4 and 8%, particularly preferably 6%.

So that the contact surface of the components with the metalization during the soldering is as large as possible, after the leveling the metalization of the high power area preferably has a thickness of 180 to 220 μm.

A ceramic substrate according to the invention composed of AlN or $Al_2O_3$ having a copper multi-level metalization with high power areas, with a metalization having higher current-carrying capacity and low power areas, with a metalization having lower current-carrying capacity, produced by the method according to any one of claims 1 to 6, is characterized in that the thickness of the metalization in the high power area is 180 to 220 μm and 20 to 50 μm in the low power area and the adhesive strength of the metalizations is above 40 N/qmm.

The edge steepness of the metalization of the high power areas is at 120 μm with a total copper thickness of 200 μm.

The method according to the invention describes a multiply applied copper paste metalization. The disclosed technical teachings enable the construction of high power areas together with low power areas next to each other on the same ceramic carrier and/or ceramic substrate composed of AlN or $Al_2O_3$.

For this purpose, first a common base metalization (high and low power areas) made of a glass-containing copper-based paste is constructed on a ceramic substrate using screen printing or other techniques such as pad printing. The glass portion of the copper-based paste is required for adhesiveness on the ceramic. The thickness of this base metalization according to the invention is 20-50 μm.

Subsequently, the high power area 1 of the circuit (see the square on the left in the drawing) is also selectively further constructed or reinforced multiple or several times using screen- or stencil printing, preferably up to a total thickness of 300-500 μm. This copper reinforcing paste has no glass component, since it is applied or imprinted on the glass-containing copper-based paste. A solder reinforcement of the glass-containing copper-based paste would not be suitable, since solder has a lower conductivity than copper. The high power areas of the circuit are, if necessary, overprinted multiple times with the copper reinforcing paste until the required thickness is reached.

Then the metalized ceramic substrate is annealed with the high and low power areas together at 850 to 950° C. under $N_2$. The ceramic substrate and/or the high power areas are then mechanically leveled and can also be provided, as required, with currentless metalizations such as Ni, NiP+Pd+Au, Ag or Ni+Au. Multiple uses can be separated by laser scribing before or after the printing of the ceramic substrate. The leveling of high power areas with thicker conducting structure, for example by a grinding process, is required to create an even surface having a roughness $R_z<5$ μm for the components, which are normally mounted with a solder layer as thin as possible. The contact surface of the components to the metalization is thereby maximized. It has been found that a leveled thinner metalization has a better thermal dissipation than a non-leveled thicker metalization. During leveling 100 μm to 150 μm can be completely removed, without deterioration of the thermal dissipation.

The metalized ceramic substrate having high and low power areas is also referred to as a multi-level substrate. The bottom of such a multi-level substrate can of course also be structured metalized, to bind the substrate on the bottom side by soldering or gluing to a cooler.

EXAMPLE

First of all, the entire electrical layout consisting of a high power area and a low power area is printed as metalization 50 μm high with a copper-based paste having a glass portion of 6% on a lasered ceramic substrate consisting of AlN having a thickness of 0.63 mm. Laser treatment of the ceramic substrate ensures, so that later a separation by severing along the break line is possible. Then only the high power area or the metalization thereof, upon which the power component is later soldered, is brought to a 350 μm metalization thickness by further multiple screen or stencil printing processes using a copper-based paste without glass component. Thereafter the metalized component is annealed at 910° C. for 8 min under $N_2$.

The high power area of the metalized and annealed ceramic substrate by itself is then in this example 310 μm high. The metalization of the low power area is 40 μm high. The high power area and/or copper thereof is then mechanically leveled by a grinding process, in order to produce a precise horizontal surface in the high power area. The copper then has a total thickness of 200 μm in the high power area after the leveling.

The adhesiveness is above 60 N/qmm. The edge steepness of the high power area is 120 μm with a total copper thickness of 200 μm.

By coordinated printing processes with stencil or printing screens of varying strength, the layer thickness of the high power area can be specifically reinforced, or this can be achieved by reducing the printing processes or the stencil height between layer thicknesses, if only a low current-carrying capacity is required.

The sole drawing depicts a cut-out from a ceramic substrate 4 made of aluminum nitride or aluminum oxide having an applied metalization, which includes a high power area 1 and a low power area 2. The metalization shown is applied identically multiple times on the ceramic substrate in the high power area 1 and can be separated by severing along a break line 3.

High power areas 1 and low power areas 2 are disposed next to each other on the ceramic substrate. High power area 1 refers to an area, which has a high current-carrying capacity and a high thermal dissipation when used. Components are mounted on high power areas 1 such as LEDs and control transistors, which become very hot in operation and/or have high switching power. The high electrical power and dissipated heat of these components must be guided or discharged.

Metalizations or conducting paths of low power areas 2 are characterized in that they may have a low thermal dissipation. These are, for example, the actual conducting paths of a circuit, often referred to as logic circuits.

An essential feature of the invention is that the high power areas 1 are leveled by a grinding process, in order to produce a precise, undulation-free, horizontal surface with small $R_z$ (preferably approx. 5 μm). Only in this way is the heat of a power component also sufficiently dissipated by a thin layer of solder (preferably approx. 10 μm).

The invention claimed is:
1. A method for producing a multi-level metallization of copper on a ceramic substrate of AlN or $Al_2O_3$, wherein high-power areas having metallizations with greater current-carrying capacity and low-power areas having metallizations with less current-carrying capacity are created on one and the same ceramic substrate, wherein the following method steps are carried out sequentially:
   e) printing a common base metallization for the high-power area and the low-power areas from a glass-containing copper-based paste using screen printing or pad printing to a thickness of 20 to 50 μm,
   f) reinforcing the base metallization in the high-power areas by printing, several or many times, a copper-reinforcement paste without any glass component onto the base metallization by means of screen printing or stencil printing up to a total copper thickness of 300 to 500 μm, g) annealing the metallized ceramic substrate with the high-power areas and the low-power areas together at 850 to 950° C. in nitrogen, h) mechanical levelling of the high-power areas in order to create a planar surface with a roughness $R_z<5$ μm; wherein the glass component of the glass-containing copper-based paste is between 4 and 8%.

2. A method according to claim 1, wherein after the levelling the high-power areas or the low-power areas are currentlessly provided with a metallization.

3. A method according to claim 1, wherein the ceramic substrate is processed by laser scribing before or after the printing in order to prepare for subsequent separation of the ceramic substrate into individual sub-substrates.

4. A method according to claim 1, wherein the glass component of the glass-containing copper-based paste is 8%.

5. A method according to claim 1, wherein after the levelling the high-power areas or the low-power areas are currentlessly provided with a metallization selected from the group consisting of Ni, NiP+Pd+Au, Ag and Ni+Au.

6. A method according to claim 1, wherein the glass component of the glass-containing copper-based paste is between 6 and 8%.

7. A method according to claim 1, wherein the glass component of the glass-containing copper-based paste is between 7 and 8%.

8. A method for producing a multi-level metallization of copper on a ceramic substrate comprising AlN, wherein high-power areas having metallizations with greater current-carrying capacity and low-power areas having metallizations with less current-carrying capacity are created on one and the same ceramic substrate, wherein the following method steps are carried out sequentially:

e) printing a common base metallization for the high-power area and the low-power areas from a glass-containing copper-based paste using screen printing or pad printing to a thickness of 20 to 50 μm, f) reinforcing the base metallization in the high-power areas by printing, several or many times, a copper-reinforcement paste without any glass component onto the base metallization by means of screen printing or stencil printing up to a total copper thickness of 300 to 500 μm, g) annealing the metallized ceramic substrate with the high-power areas and the low-power areas together at 850 to 950° C. in nitrogen, h) mechanical levelling of the high-power areas in order to create a planar surface with a roughness $R_z<5$ μm; wherein the glass component of the glass-containing copper-based paste is between 4 and 8%.

9. A method according to claim 8, wherein after the levelling the high-power areas or the low-power areas are currentlessly provided with a metallization selected from the group consisting of Ni, NiP+Pd+Au, Ag and Ni+Au.

10. A method according to claim 8, wherein the glass component of the glass-containing copper-based paste is between 7 and 8%.

11. A method according to claim 8, wherein the glass component of the glass-containing copper-based paste is 8%.

\* \* \* \* \*